(12) United States Patent
Bradley

(10) Patent No.: US 7,126,347 B1
(45) Date of Patent: Oct. 24, 2006

(54) PRECISION WIDEBAND 50 OHM INPUT AND 50 OHM OUTPUT OR 100 OHM OUTPUT DIFFERENTIAL REFLECTION BRIDGE

(75) Inventor: Donald Anthony Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 11/323,070

(22) Filed: Dec. 30, 2005

(51) Int. Cl.
*G01R 27/28* (2006.01)

(52) U.S. Cl. ...................... 324/657; 324/648

(58) Field of Classification Search ................ 324/648, 324/657
See application file for complete search history.

(56) References Cited

U.S. PATENT DOCUMENTS

| | | | | |
|---|---|---|---|---|
| 3,636,439 A | * | 1/1972 | Colligan | 324/660 |
| 4,962,359 A | * | 10/1990 | Dunsmore | 324/638 |
| 5,150,063 A | * | 9/1992 | Burkhard et al. | 324/646 |
| 6,608,492 B1 | * | 8/2003 | Entenmann | 324/706 |
| 6,690,177 B1 | * | 2/2004 | Dalebroux | 324/648 |

* cited by examiner

*Primary Examiner*—Walter Benson
(74) *Attorney, Agent, or Firm*—Fliesler Meyers LLP (57) ABSTRACT

A differential reflection bridge is provided for a 100 Ohm load, the bridge not being compromised by a translation to a 50 Ohm system. The reflection bridge uses two transmission line baluns. The first traditional balun T1 connects the input signal source to a resistor bridge. The second balun T2 connects between a central node of the resistor bridge and an output OUT as well as a second test port that eliminates a path to ground. With no ground path the bridge is immune to common mode impedance disturbances.

13 Claims, 9 Drawing Sheets

PRECISION WIDEBAND 50 OHM INPUT AND 50 OHM OUTPUT OR 100 OHM OUTPUT DIFFERENTIAL REFLECTION BRIDGE

BACKGROUND

1. Technical Field

The present invention relates to making differential impedance measurements of a resistive device using a reflection bridge. More particularly, the present invention relates to a reflection bridge providing for differential measurements of both 50 Ohm and 100 Ohm complex impedances.

2. Related Art

Conventional differential measurement systems for measuring 100 Ohm components included balanced 100 Ohm transmission lines. Characterization of components was provided using multiple single port measurements. The balanced parameters were extracted from at least two single ended measurements.

Figure 1:
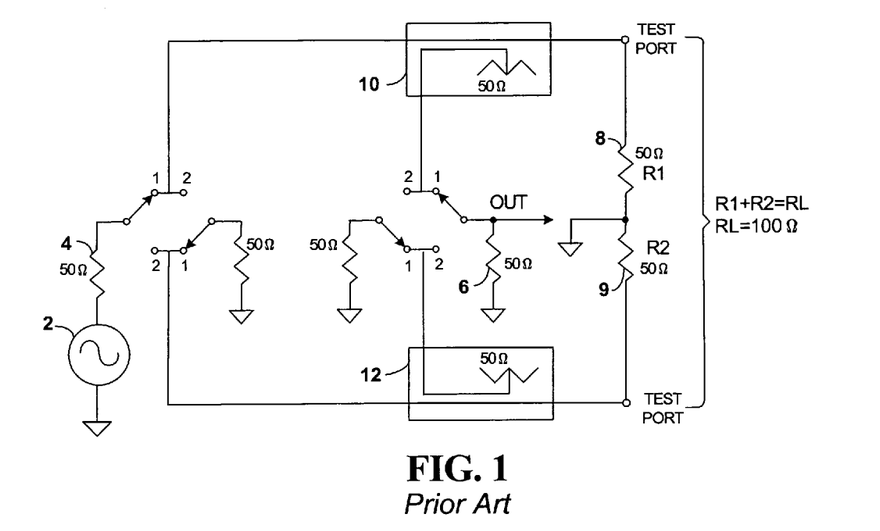
FIG. 1 shows components of a differential bridge that can be used to make a 100 Ohm differential S11 measurement using two single ended S11 measurements.

FIG. 1 shows a conventional differential bridge used to make differential measurements by obtaining two single ended measurements. The test system includes a signal source 2 connected through a 50 Ohm line 4 to provide an input. A resistive load 8, labeled R1, and resistive load 9, labeled R2, are each connected to one of two test ports TEST PORT 1 and TEST PORT 2 to be measured. A measurement output OUT is provided from one terminal of a resistor 6, with a second end of resistor 6 connected to ground. Two couplers 10 and 12 individually connect the test ports with the signal source 2 to one of the test ports, and return a reflected signal to the output OUT. The couplers 10 and 12 are individually connected with switches, the first coupler 10 being connected with the switches in the "1" position, and the second coupler 12 being connected with the switches in the "2" position.

The two separate measurements at the output OUT determine θ1 and θ2. The values for θ1 and θ2 are in turn used to provide a combined differential measurement $\theta_{DIFF}$. The measurements of θ1 and θ2 are made using two single ended 50 Ohm S11 measurements between two test ports TEST PORT 1 and TEST PORT 2. With RL=R1+R2, and RL=100 Ohms, a 100 Ohm differential S11 measurement is effectively obtained. Complex math is needed to determine the differential measurement value $\theta_{DIFF}$ using the equations shown to follow.

$$\theta = \frac{R-50}{R+50}, R = 50\left(\frac{1+\theta}{1-\theta}\right)$$

$$R_{DIFF} = R1 + R2$$

$$R_{DIFF} = 50\left(\frac{1+\theta 1}{1-\theta 1}\right) + 50\left(\frac{1+\theta 2}{1-\theta 2}\right)$$

$$\theta_{DIFF} = \frac{R_{DIFF} - 100}{R_{DIFF} + 100}$$

$$\theta_{DIFF} = \frac{50\left(\frac{1+\theta 1}{1-\theta 1}\right) + 50\left(\frac{1+\theta 2}{1-\theta 2}\right) - 100}{50\left(\frac{1+\theta 1}{1-\theta 1}\right) + 50\left(\frac{1+\theta 2}{1-\theta 2}\right) + 100}$$

More recently a 50 Ohm to 100 Ohm balanced transformer was introduced to alleviate some of the problems encountered using the two measurement extraction approach. The balanced transformer approach, however, has limitations due to the need of a broad band $1:\sqrt{2}$ turns ratio. The turns ration is provided by a balanced transformer, which is the heart of the converter.

Figure 2:
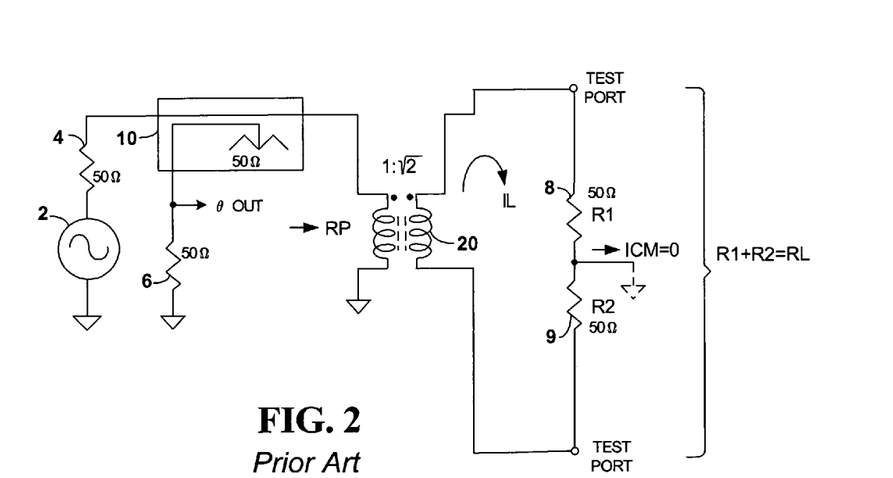
FIG. 2 shows components of a differential bridge used to make a 100 Ohm differential S11 measurement that uses a 50 Ohm to 100 Ohm transformer with a $1/\sqrt{2}$ turns ratio.

FIG. 2 shows components of a differential bridge used such a balanced transformer 20. The differential bridge uses the signal source 2 and resistor 4 as provided through a coupler 10, as in FIG. 1. Unlike in FIG. 1, the balanced transformer 20 is used to connect the coupler 10 output to both test ports TEST PORT 1 and TEST PORT 2 in FIG. 2 so that an additional coupler and switches as in FIG. 1 are not needed. The output θ is provided from the coupler 10 through a resistor 6 connected to ground. The common mode current does not appear due to the "floating" secondary TEST PORT 2 replacing ground connections. Components carried over from FIG. 1 to FIG. 2 are similarly labeled, as will be components carried over in subsequent drawings.

The transformer 20 transforms from 50 Ohms to 100 Ohms with a turns ratio of $1:\sqrt{2}$ turns ratio, or $\sqrt{(100/50)}=1.4142$. The transformer 20 is difficult to construct because of the non-integer or half-integer value of the turns ratio. A practical transformer typically requires a turns ratio ranging from 1 to 1.5. The RL to RP value would be $1.5^2$ or 2.25. Using the specially constructed transformer to provide the turn ratio shown, a single test measurement of θ can be used to determine the resistance RL using the following formulas:

$$RP = \frac{RL}{N^2} = \frac{RL}{\sqrt{2}^2} = \frac{RL}{2}$$

$$\theta = \frac{\frac{RL}{2} - 50}{\frac{RL}{2} + 50}$$

$$\theta = \frac{RL - 100}{RL + 100}$$

The 50 Ohm bridge would be balanced with 50 Ohms at its input and 50*2.25=112.5 Ohms between the differential test port outputs TEST PORT 1 and TEST PORT 2. Because the RL typically cannot be 112.5, post processing can correct for this error after an open-short-load (OSL) calibration.

Figure 3:
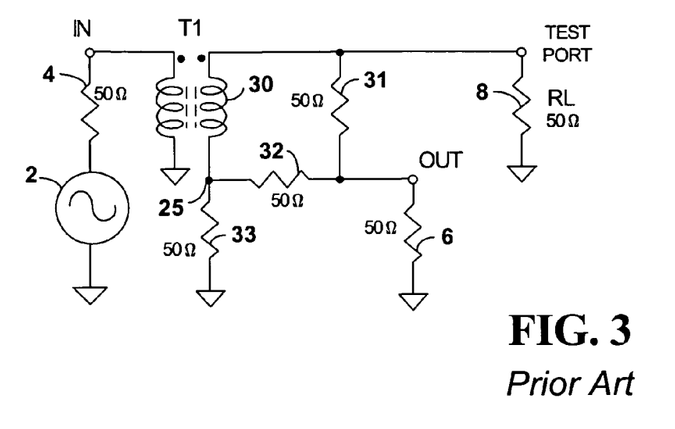
FIG. 3 shows components of a basic measurement bridge.

FIG. 3 shows components of a conventional basic measurement bridge. The bridge is balanced when the load resistor 8, labeled RL, is 50 Ohms and the output OUT is at 0 Volts. The bridge of FIG. 3 uses resistors 31–33 as opposed to one of couplers 10 or 12 of FIG. 1 to provide reflected test signals from the test port to the output OUT for measurement. A transformer 30 (labeled T1) connects the signal source 2 and resistor 4 to the bridge formed by resistors 31–33. The T1 transformer 30 has a first winding connecting the resistor 4 to ground. A second winding of he T1 transformer 30 connects the TEST PORT and one end of resistor 31 to a common node 25. The common node 25 is provided between resistors 32 and 33. The common connection of resistors 31 and 32 form the output port OUT. The output port OUT is where test measurements are obtained, and is connected from the resistor 51 through a resistor 6 to ground.

Only a single ended measurement of the load resistor RL is available from TEST PORT 1, so multiple measurements must be made to obtain a differential measurement, similar to that described with respect to FIG. 1. Further, with a ground path through resistor 6, the bridge is subject to common mode impedance disturbances.

Figure 4:
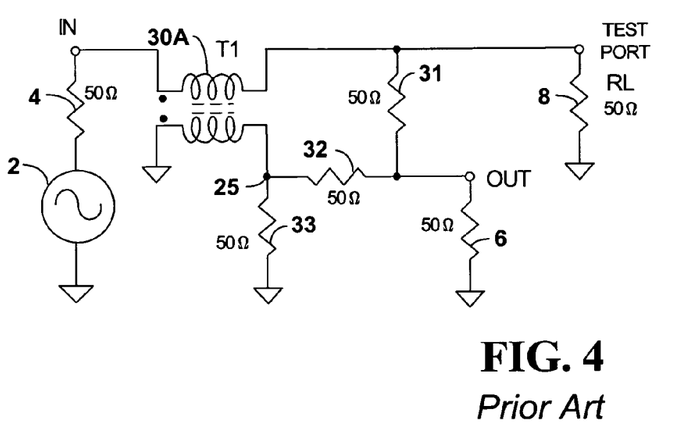
FIG. 4 shows FIG. 3 modified to provide the transformer T1 using a transmission line balun.

FIG. 4 shows modification of FIG. 3 to provide a transmission line balun 30A. A first winding of T1 balun 30A connects from the input IN to the TEST PORT. A second winding of the T1 balun 30A connects from the common node 25 to ground. The transmission line balun 30A can be provided using a standard 50 Ohm transmission line with ferrite beads placed over it. The ferrite beads extend of the balun characteristics to low frequencies. This allows operation of the transformer T1 from the low megahertz to the tens of gigahertz.

It would be desirable to provide a device to measure 100 Ohm components using a standard 50 Ohm system without requiring a two measurement process, and without requiring use of a balanced transformer.

SUMMARY

According to the present invention a measuring device is provided that uses a true 100 Ohm differential bridge that is not compromised by the translation from 50 to 100 Ohms through a non-ideal transformer. The measuring device although providing measurements of a 100 Ohm component also interfaces with a standard 50 Ohm system. The reflection bridge further allows for differential measurements between two test ports rather than single ended measurements, enabling elimination of common mode impedance disturbances.

The reflection bridge according to the present invention includes two baluns. A first traditional balun T1 connects the input signal source to a resistor bridge. A second balun T2 connects between the central node of the resistor bridge and the output OUT as well as to a second test port that eliminates a path to ground. With no ground path the bridge is immune to common mode impedance disturbances.

The system can be designed to test any load resistance. The system can be modified simply by changing resistors in the reflection bridge and changing the characteristic impedance of the transmission lines used for the baluns to the desired measurement impedance.

The first T1 and second T2 baluns can be connected as standard transformers or connected as transmission line baluns. Neither the T1 nor T2 balun is ideal, so non-standard baluns like ones that use a $1:\sqrt{2}$ turn ratio are unnecessary.

BRIEF DESCRIPTION OF THE DRAWINGS

Further details of the present invention are explained with the help of the attached drawings in which.

DETAILED DESCRIPTION

Figure 5:
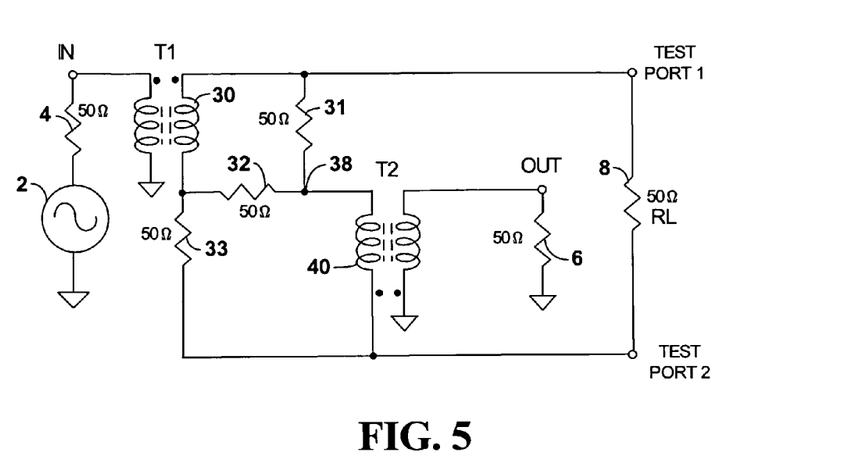
FIG. 5 shows components of a differential measurement bridge according to embodiments of the present invention.

FIG. 5 shows a differential measurement bridge according to embodiments of the present invention. The bridge includes 50 Ohm resistors 31–33 similar to the resistive bridge of FIG. 3. A T1 transformer 30 couples a signal source 2 and resistor 4 to the resistors 31–33. A resistor 6 connects a measurement output OUT to ground, similar to FIG. 3.

FIG. 5 according to the present invention, and in contrast with FIG. 3, further includes a second transformer labeled T2. The T2 transformer 40 has a first winding connecting from the output node OUT to ground. A second winding connects a node 38 between resistors 31 and 32 to a second test port TEST PORT 2. The second test port TEST PORT 2 replaces the ground connection of FIG. 3. The second test port TEST PORT 2 is also connected to the resistor 33 and the 50 Ohm RL load resistor 8. This allows RL to be measured differentially directly, rather than through single ended measurements. RL also now has no path to ground, making it immune to common mode impedance disturbances.

Figure 6:
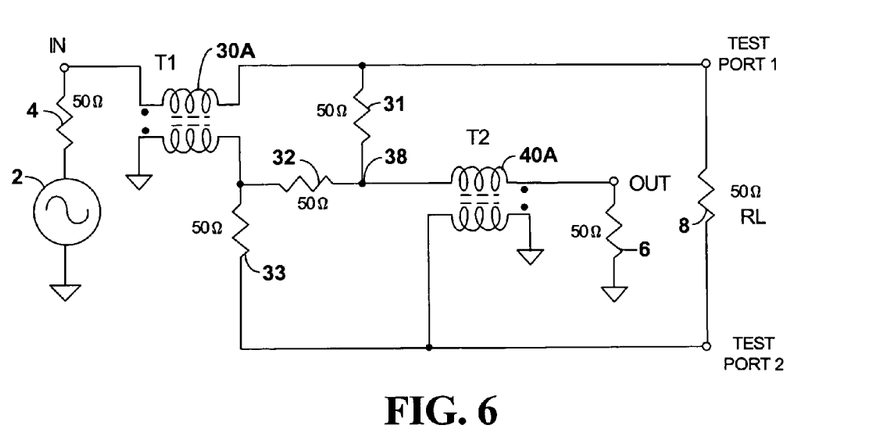
FIG. 6 shows modification of FIG. 5 to provide transformers T1 and T2 using transmission line baluns.

FIG. 6 shows a further embodiment of the present invention with transformers 30 and 40 of FIG. 5 reconfigured as transmission line baluns 30A and 40A. As in FIG. 4, the transmission line balun 30A has a first winding connecting the signal source 2 and 50 Ohm resistor 4 to TEST PORT 1. A second winding connects the common node 25 to ground. According to the present invention, the second T2 transformer 40A has a first winding connecting the output OUT to the node 38. A second winding of transformer 40A connects the second test port TEST PORT 2 to ground.

Figure 7:
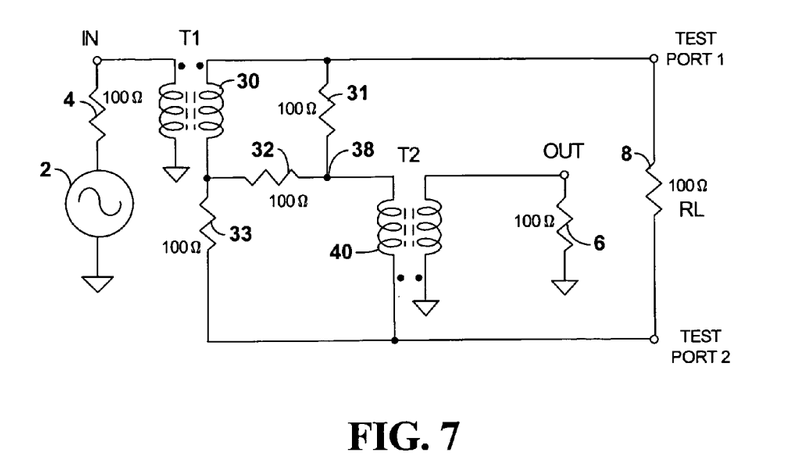
FIG. 7 shows modification of FIG. 5 to provide for measurement of a 100 Ohm resistance RL.

FIG. 7 shows modification to the bridge of FIG. 5 to change the 50 Ohm resistors to 100 Ohm resistors. Resistors 4, 31–33 and the output resistor 6 are changed to 100 Ohms. The RL load resistor 8 is also changed to 100 Ohms. The bridge will be balanced when RL 8 is 100 Ohms, causing an output OUT of zero volts.

Figure 8:
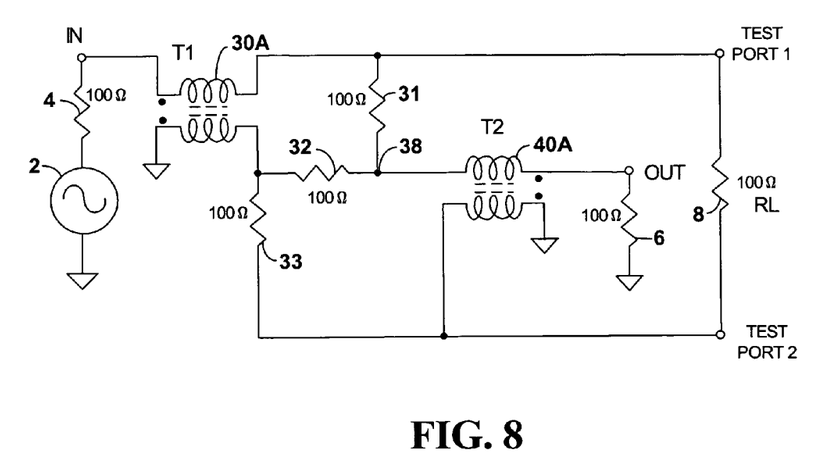
FIG. 8 shows modification of FIG. 6 to provide for measurement of a 100 Ohm resistance RL using transmission line baluns for T1 and T2.

FIG. 8 shows modification to the bridge of FIG. 6 to change to 100 Ohm resistors. The T1 and T2 transmission line baluns 30A and 40A are each formed using a piece of 100 Ohm coax transmission line with ferrite beads placed over it.

Figure 9:
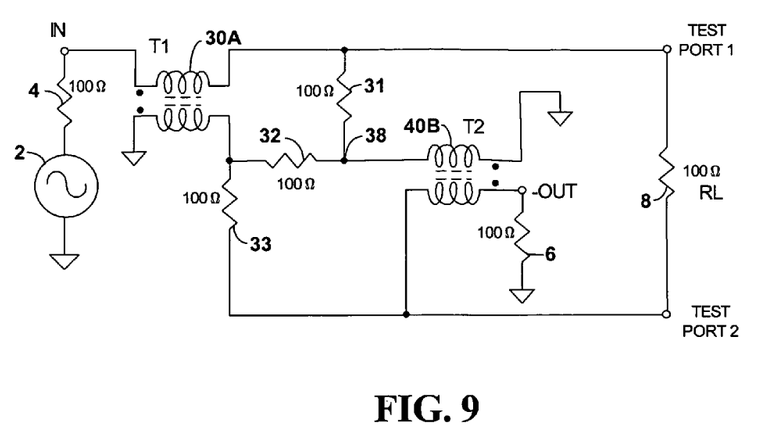
FIG. 9 shows modification of FIG. 8 to show the inversion of the output of transformer T2 to provide for common mode balance at the test ports.

FIG. 9 shows modification to the bridge of FIG. 8 to invert the T2 transmission line balun, now labeled 40B. Inversion of the T2 balun 40B is accomplished by connecting a first winding from ground to the node 38 between nodes 31 and 32. A second winding is connected between the output OUT and the second test port TEST PORT 2. The second winding connected to the bridge output OUT is formed by the center pin of balun 40B, while the outer conductor of the balun 40B forms the first winding. Connecting the balun 40B in this manner provides common mode balance at the first and second test ports TEST PORT 1 and TEST PORT 2. The inversion can be reversed using post processing techniques.

Figure 10:
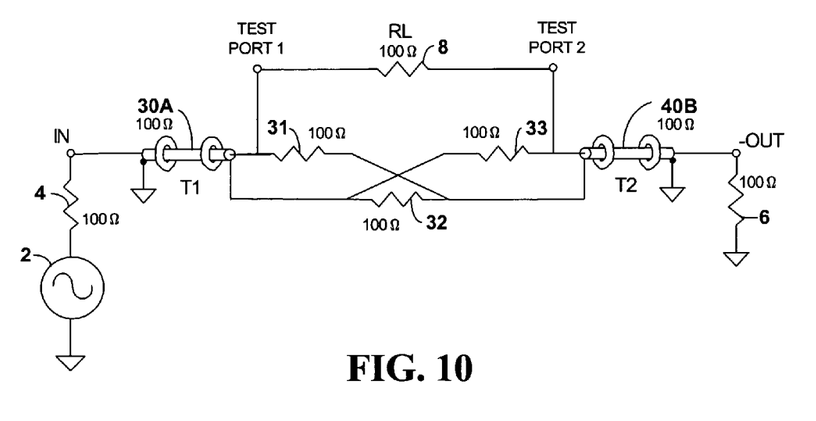
FIG. 10 illustrates the hardware implementation for the circuit of FIG. 9.

FIG. 10 illustrates how hardware is positioned to form the circuit of FIG. 9. The T1 and T2 baluns 30A and 40B are illustrated as a perspective drawing showing a section of 100 Ohm coax line with surrounding ferrite beads. The resistors 4, 6 and 31–33 and the RL resistor 8 show the relative position of these resistors in an actual circuit.

Figure 11:
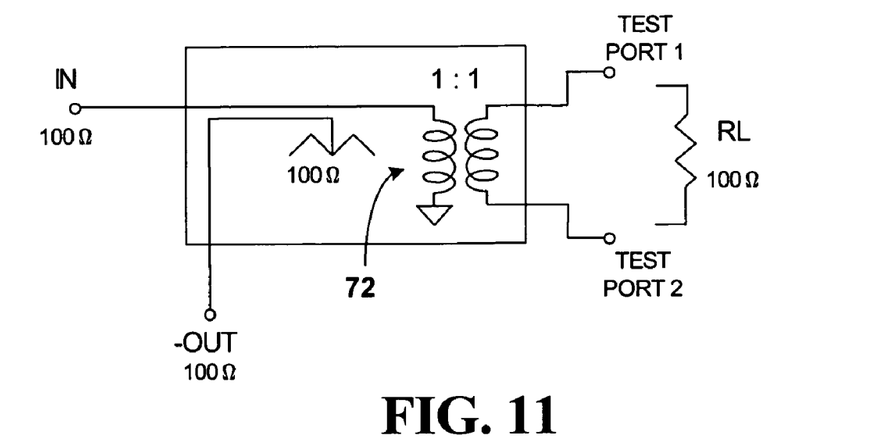
FIG. 11 shows a simplified equivalent circuit for the components of FIG. 10.

FIG. 11 shows a simplified equivalent circuit diagram for the components of FIG. 10. The equivalent circuit illustrates that the transformer 72 has a 1:1 turns ratio, and that dual TEST PORTS 1 and 2 connect to measure a 100 Ohm load RL. The test signal input IN and output OUT are also shown connected to 100 Ohm devices.

One additional modification to the bridge illustrated by FIGS. 9–11 makes it more practical. The 100 Ohm transmission line used for baluns T1 and T2 are nonstandard. Additionally, the input IN and coupled output OUT impedances are also nonstandard, as these ports typically interface with 50 Ohm systems. Accordingly, some embodiments of the present invention use 50 Ohm input IN and coupled output OUT impedances. Transformation from 50 Ohm devices and 50 Ohm baluns is, thus, needed up to 100 Ohms for the bridge resistors 31–33. The baluns for T1 and T2 can, thus, be provided with 50 Ohm transmission lines. This transformation can be accomplished by a minimum loss 50 to 100 Ohm matching pad. The penalty for using the matching pad is a power loss of 7.66 dB at the output Test Port.

Figure 12:
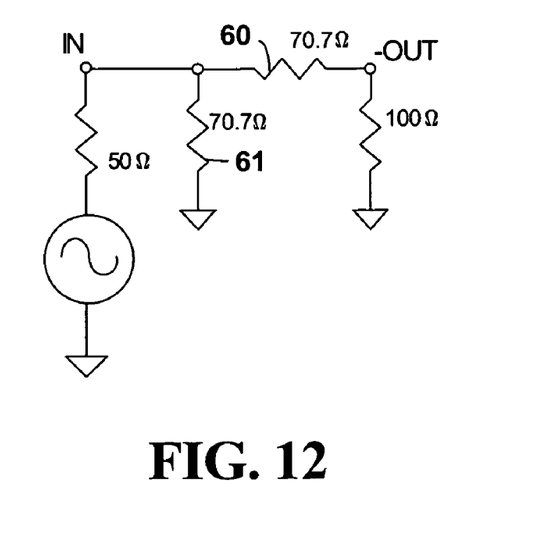
FIG. 12 shows circuitry needed for a 50 to 100 Ohm attenuator.
Figure 13:
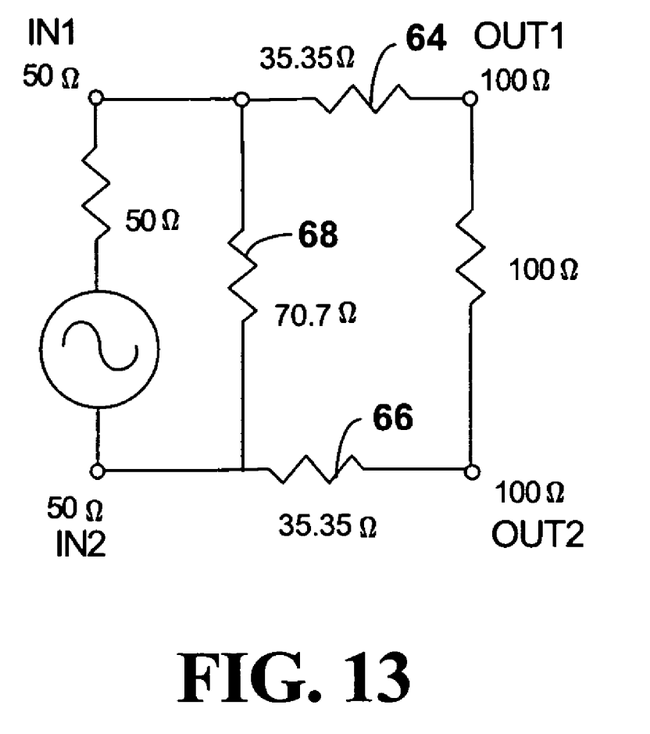
FIG. 13 shows the attenuator of FIG. 12 configured in a balanced form.

FIGS. 12 and 13 illustrate components for providing a 50 Ohm to 100 Ohm transformation by using a minimal loss attenuator. In FIG. 12, the attenuator is provided by one 70.7 Ohm resistor 60 connected between an input IN and output OUT port. Another 70.7 Ohm resistor 61 connects from the input IN to ground. The input IN is at 50 Ohms, while the output OUT is transformed to 100 Ohms. FIG. 13 shows a balanced attenuator that can more easily be used with the circuit of FIG. 10. The circuit of FIG. 13 includes a first 35.35 Ohm resistor 64 connected from a first input IN1 to a first output OUT1. A second 35.35 Ohm resistor 66 connects a second input IN2 to a second output OUT2. A 70.7 Ohm resistor 66 connects the first input IN1 and second input IN2. The inputs IN1 and IN2 are at 50 Ohms, while the outputs OUT1 and OUT2 are at 100 Ohms.

Figure 14:
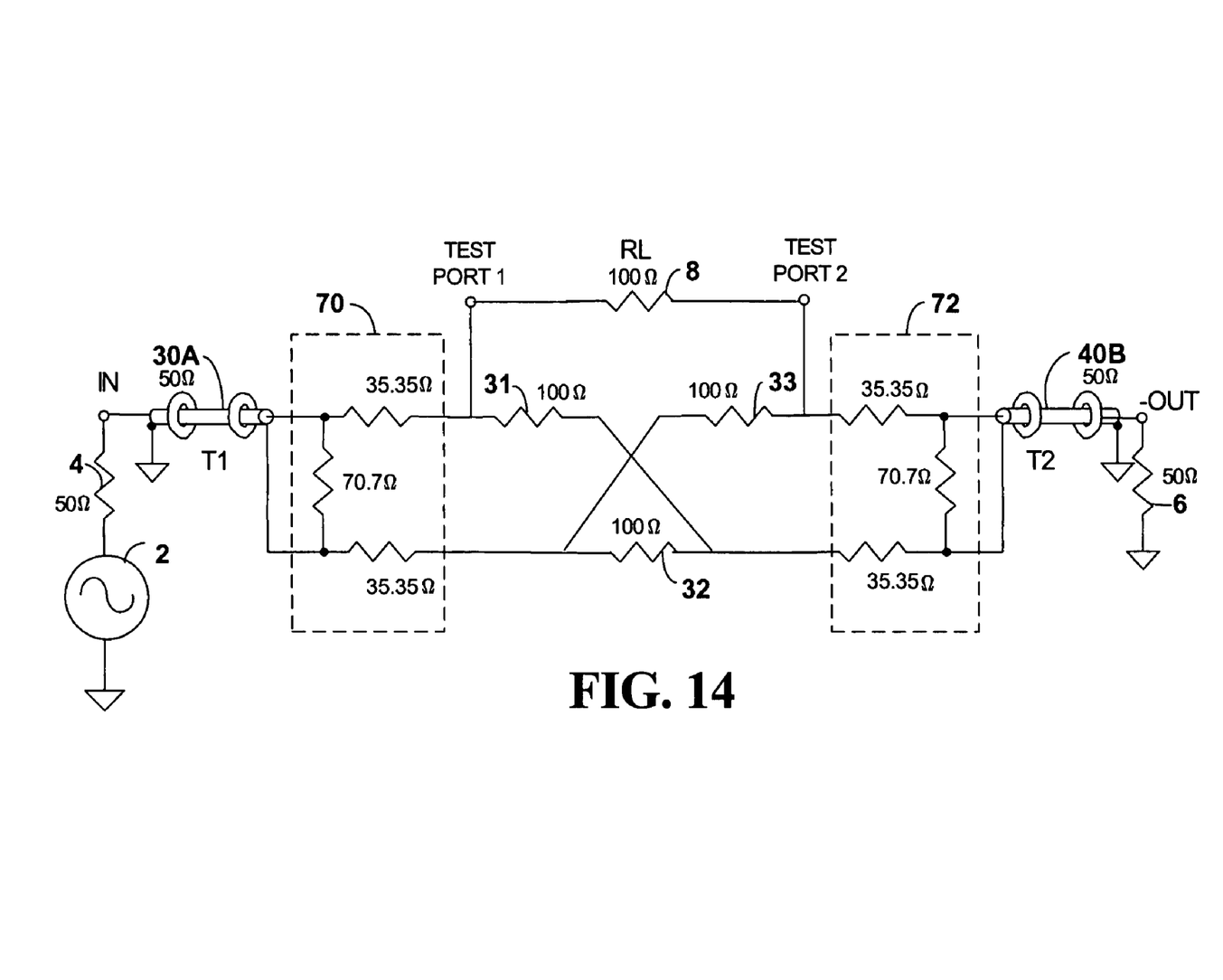
FIG. 14 shows the circuit of FIG. 10 as modified to include balanced attenuators as shown in FIG. 13.

FIG. 14 shows placement of balanced attenuators 70 and 72 into the circuit of FIG. 10. Use of the balanced attenuators 70 and 72 allows input IN and output OUT impedances as well as balun impedances to be 50 Ohms, while the remaining impedances are 100 Ohms, as illustrated. The resistors 31–33, as well as resistors of the attenuators 70 and 72 can be constructed with discrete resistors, thick film, thin film on substrate, or any technique that allows controlled impedances.

Figure 15:
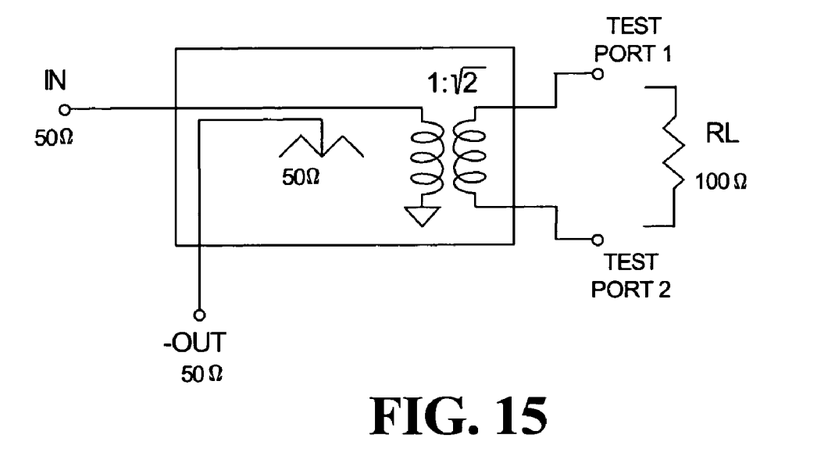
FIG. 15 shows a simplified equivalent circuit for the components of FIG. 14.

FIG. 15 is a simplified equivalent circuit diagram for the components of FIG. 14. The equivalent circuit illustrates that a transformer with attenuators now effectively provides a 1:√2 turns ratio. The dual test ports TEST PORT 1 and TEST PORT 2 connect to measure a 100 Ohm load RL. The test signal input IN and output OUT, however, are designed to connect to 50 Ohm devices.

Although the present invention has been described above with particularity, this was merely to teach one of ordinary skill in the art how to make and use the invention. Many additional modifications will fall within the scope of the invention, as that scope is defined by the following claims.

What is claimed:

1. A differential measurement bridge comprising:
a first transformer having a first terminal forming an input (IN) of the bridge, a second terminal connected to a ground, a third terminal forming a first test port of the bridge, and a fourth terminal;
a first resistor connecting the fourth terminal of the transformer to a second test port of the bridge;
a second resistor connecting the first test port to a central connection node;
a third resistor connecting the fourth terminal of the transformer to the central connection node; and
a second transformer having a first terminal forming an output terminal (OUT) of the bridge, a second terminal connected to ground, a third terminal connected to the central connection node and a fourth terminal connected to the second test port.

2. The differential measurement bridge of claim 1,
wherein the first transformer comprises: a first line connecting the first terminal at the input (IN) of the bridge to the second terminal connected to ground; and a second line connecting the third terminal forming the first test port to the fourth terminal, the first and second line being inductively coupled together; and
wherein the second transformer comprises: a first line connecting the first terminal forming the output (OUT) of the bridge to the second terminal connected to ground; and a second line connecting the third terminal at the central connection node to the fourth terminal at the second test port, the first and second line of the second transformer being inductively coupled together.

3. The differential measurement bridge of claim 1,
wherein the first transformer comprises a transmission line balun having a first line connecting the first terminal at the input (IN) of the bridge to the third terminal forming the first test port of the bridge; and a second line connecting the second terminal as connected to ground to the fourth terminal, wherein the first line and the second line are inductively coupled together; and
wherein the second transformer comprises a transmission line balun having a first line connecting the first terminal forming the output (OUT) of the bridge to the third terminal at the central connection node; and a second line connecting the fourth terminal at the second test port to the second terminal connected to ground, wherein the first line and the second line of the second transmission line balun are inductively coupled together.

4. The differential measurement bridge of claim 3, wherein the first line of the second transmission line balun is formed from a center conductor pin, and wherein the second line of the second transmission line balun is formed by an outer conductor.

5. The differential measurement bridge of claim 3, wherein the second line of the second transmission line balun is formed from a center conductor pin, and wherein the second line of the second transmission line balun is formed by an outer conductor.

6. The differential measurement bridge of claim 3, wherein ferrite beads are placed over the first and second transmission lines of the first and second transmission line baluns.

7. The differential measurement bridge of claim 1, further comprising:
a fourth resistor connecting the input (IN) of the bridge to a signal source; and a fifth resistor connecting the output to ground.

8. The differential measurement bridge of claim 7, wherein when a load being tested as connected between the first test port and the second test port has a resistance of substantially 50 ohms, the first, second, third, fourth and fifth resistors have a resistance of substantially 50 ohms.

9. The differential measurement bridge of claim 7, wherein when a load being tested as connected between the first test port and the second test port has a resistance of substantially 100 ohms, the first, second, third, fourth and fifth resistors have a resistance of substantially 100 ohms.

10. The differential measurement bridge of claim 1,
wherein the first transformer comprises a first balun and a first attenuator, the first balun including first and second lines, and the first attenuator transforming from a first resistance at the first balun to a second resistance; and
wherein the second transformer comprises a second balun and a second attenuator, the second balun including first and second lines, and the second attenuator transforming the first resistance at the second balun to the second resistance.

11. The differential measurement bridge of claim 10,
wherein the first balun comprises: a transmission line balun having a first line connecting the first terminal at the input (IN) of the bridge to the third terminal forming a first attenuator first connection port; and a second line connecting the second terminal as connected to ground to the fourth terminal forming a first attenuator second connection point, wherein the first line and the second line are inductively coupled together;
wherein the first attenuator comprises: a first attenuator resistor having a first value connected from the first attenuator first connection port of the first balun to the first attenuator second connection point; a second attenuator resistor having a second value connected from the first attenuator first connection port to the first test port of the bridge; and a third attenuator resistor having the second value connected from the first attenuator second connection point to the central connection node of the first balun;
wherein the second balun comprises: a transmission line balun having a first line connecting the first terminal forming the output (OUT) of the bridge to the third terminal forming a second attenuator first connection point; and a second line connecting the fourth terminal forming a second attenuator second connection point to the second terminal connected to ground, wherein the first line and the second line of the second transmission line balun are inductively coupled together; and
wherein the second attenuator comprises: a fourth attenuator resistor having the first value connected from the second attenuator first connection port of the second balun to the second attenuator second connection point; a fifth attenuator resistor having the second value connected from the second attenuator first connection port to the second test port of the bridge; and a sixth attenuator resistor having the second value connected from the second attenuator second connection point to the central connection node of the second balun.

12. The differential measurement bridge of claim 11,
wherein the first value of the first and fourth resistors comprise a resistance of substantially 70.7 ohms, and
wherein the second value of the second, third, fifth and sixth resistors comprise a resistance of substantially 35.35 ohms.

13. A differential measurement bridge comprising:
a first balun having a first line connecting an input (IN) of the bridge to a first balun first output, and a second line connecting a ground connection to a first balun second output;
a first attenuator having a first attenuator resistor connecting the first balun first output to a first bridge test port, a second attenuator resistor connecting the first balun first output to a first attenuator connection node, and a third attenuator resistor connecting the first attenuator connection node to a first attenuator output;
a first resistor connecting the first attenuator output to a second bridge test port;
a second resistor connecting the first bridge test port to the first attenuator common connection node;
a third resistor connecting the first attenuator output to the common connection node; and
a second balun having a first line connecting the ground connection to a second balun first output, and a second line connecting the second bridge output to the second balun second output;
a second attenuator having a third attenuator resistor connecting the second balun first output to the second bridge test port, a fourth attenuator resistor connecting the second balun first output to the second balun second output, and a fourth attenuator resistor connecting the second attenuator connection node to the common connection node.

* * * * *